United States Patent
Hirosawa et al.

(10) Patent No.: US 11,126,237 B2
(45) Date of Patent: Sep. 21, 2021

(54) ELECTRIC POWER SUPPLY SYSTEM

(71) Applicant: TOSHIBA CLIENT SOLUTIONS CO., LTD., Tokyo (JP)

(72) Inventors: Hideki Hirosawa, Fujioka Gumma (JP); Tomonori Tsutsui, Tokyo (JP)

(73) Assignee: TOSHIBA CLIENT SOLUTIONS CO., LTD., Tokyo (JP)

( * ) Notice: Subject to any disclaimer, the term of this patent is extended or adjusted under 35 U.S.C. 154(b) by 203 days.

(21) Appl. No.: 16/216,556

(22) Filed: Dec. 11, 2018

(65) Prior Publication Data
US 2019/0187766 A1    Jun. 20, 2019

(30) Foreign Application Priority Data

Dec. 15, 2017   (JP) .............................. JP2017-240780

(51) Int. Cl.
  *G06F 1/32*    (2019.01)
  *G06F 1/26*    (2006.01)
  *G06F 1/324*   (2019.01)
  *G01R 19/165*  (2006.01)
  *G06F 1/28*    (2006.01)
  *G05F 1/46*    (2006.01)

(52) U.S. Cl.
  CPC ....... *G06F 1/263* (2013.01); *G01R 19/16542* (2013.01); *G06F 1/28* (2013.01); *G06F 1/324* (2013.01); *G05F 1/46* (2013.01)

(58) Field of Classification Search
  CPC . G06F 1/263; G06F 1/28; G06F 1/324; G01R 19/16542; G05F 1/46
  See application file for complete search history.

(56) References Cited

U.S. PATENT DOCUMENTS 6,301,344 B1 * 10/2001 Meyer ..................... H04M 1/18
                                                    379/143
2006/0282902 A1 * 12/2006 Matsushita ........... G06F 21/554
                                                      726/26
2007/0216363 A1 *  9/2007 Kawamoto ............. G06F 1/263
                                                    320/132

(Continued)

FOREIGN PATENT DOCUMENTS

JP    2004-215413 A    7/2004
JP    2007-072962 A    3/2007

(Continued)

*Primary Examiner* — Zahid Choudhury
(74) *Attorney, Agent, or Firm* — Knobbe, Martens, Olson & Bear, LLP

(57) ABSTRACT

According to one embodiment, an electric power supply system includes a processor, a power circuit and an embedded controller. The processor includes a first controller configured to modify an operating frequency of the processor and a second controller configured to modify an operating power of the processor. The power circuit and the embedded controller detect a presence or an absence of a battery in parallel. The power circuit instructs the first controller to modify the operating frequency when removal of the battery is detected. The embedded controller causes the second controller to modify the operating power via a Basic Input/Output System (BIOS) when the removal of the battery is detected, and causes the first controller to stop modify the operating power via the power circuit.

5 Claims, 13 Drawing Sheets

(56) References Cited

U.S. PATENT DOCUMENTS

| | | | | |
|---|---|---|---|---|
| 2008/0028247 | A1* | 1/2008 | Muraoka | G06F 21/86 |
| | | | | 713/340 |
| 2009/0278679 | A1* | 11/2009 | Dailey | G06F 9/542 |
| | | | | 340/500 |
| 2011/0047396 | A1 | 2/2011 | Kawamoto et al. | |
| 2013/0195496 | A1 | 8/2013 | Yamazawa | |
| 2014/0032953 | A1* | 1/2014 | Wei | G06F 1/3234 |
| | | | | 713/323 |
| 2016/0020624 | A1* | 1/2016 | Chang | H02J 7/0077 |
| | | | | 320/136 |

FOREIGN PATENT DOCUMENTS

| | | |
|---|---|---|
| JP | 2012-249358 A | 12/2012 |
| JP | 2013-158207 A | 8/2013 |

* cited by examiner

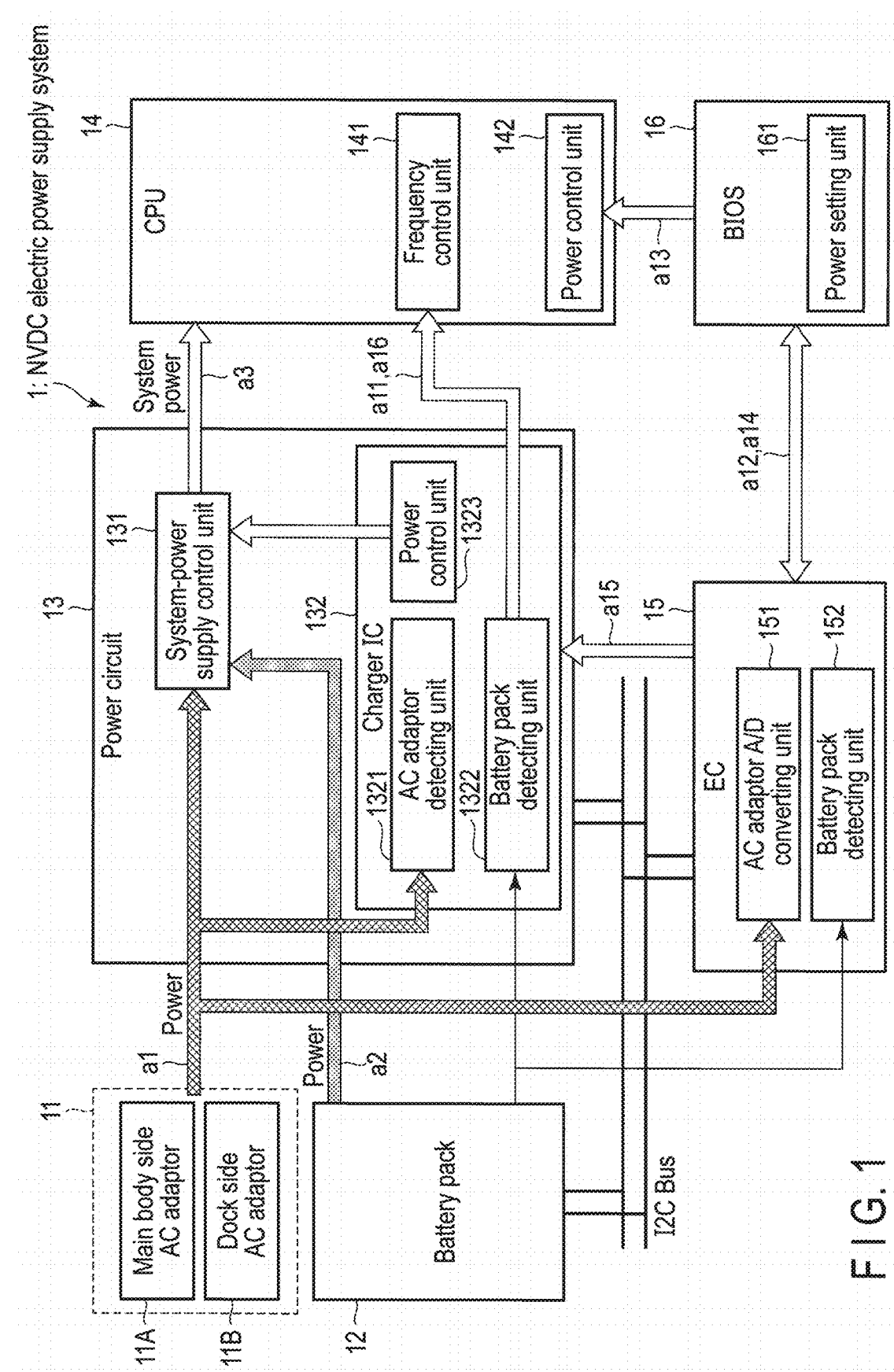
F I G. 1

|  | Battery present + battery capacity ≧ threshold | Battery absent or Battery present + battery capacity < threshold |
|---|---|---|
| Continuous mode | Normal power | Minimum power |
| Peak mode | Peak power | Minimum power |

Continuous current value  c1
| Bit | Name | Description | Initial value |
|---|---|---|---|
| 15-13 | Reserved | Reserved | — |
| 12-2 | Current limit 1 | — | 0 |
| 1-0 | Reserved | Reserved | — |
EC→Charger IC [register]
• Main body side AC adaptor (45w):2.29A
• Dock side AC adaptor (120w/180w):6.08A
F I G. 6
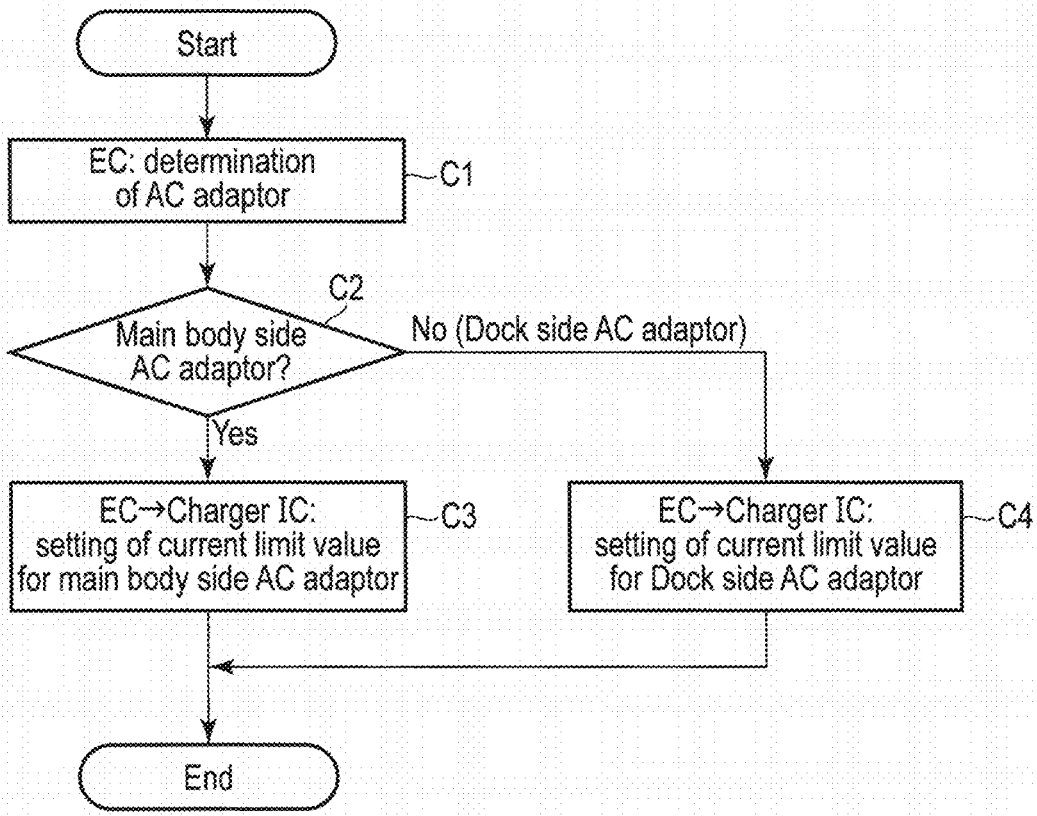
F I G. 7

| | Battery present | Battery absent |
|---|---|---|
| System power | Battery specification | Voltage value at which operation is carried out in step-down mode |

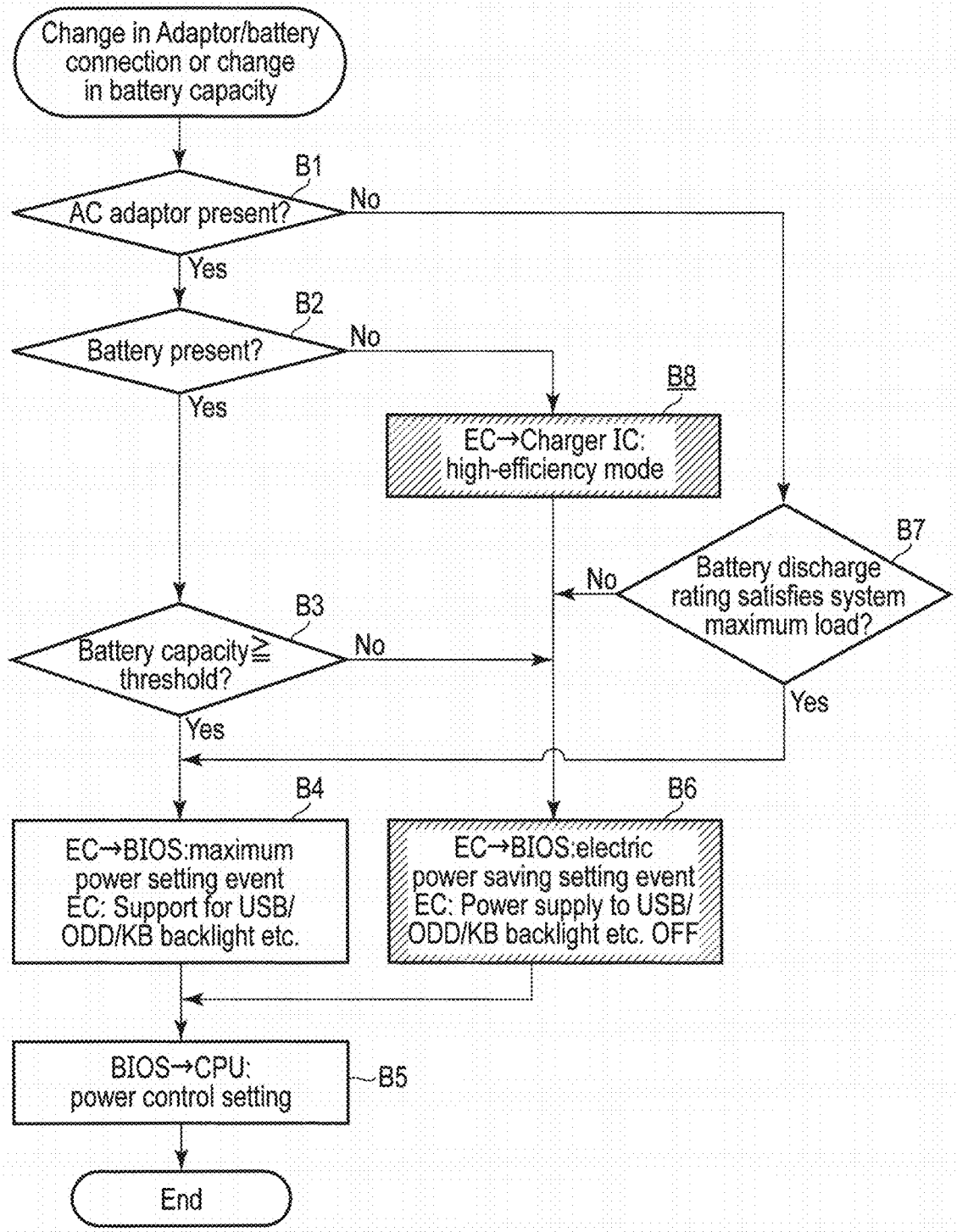
F I G. 11

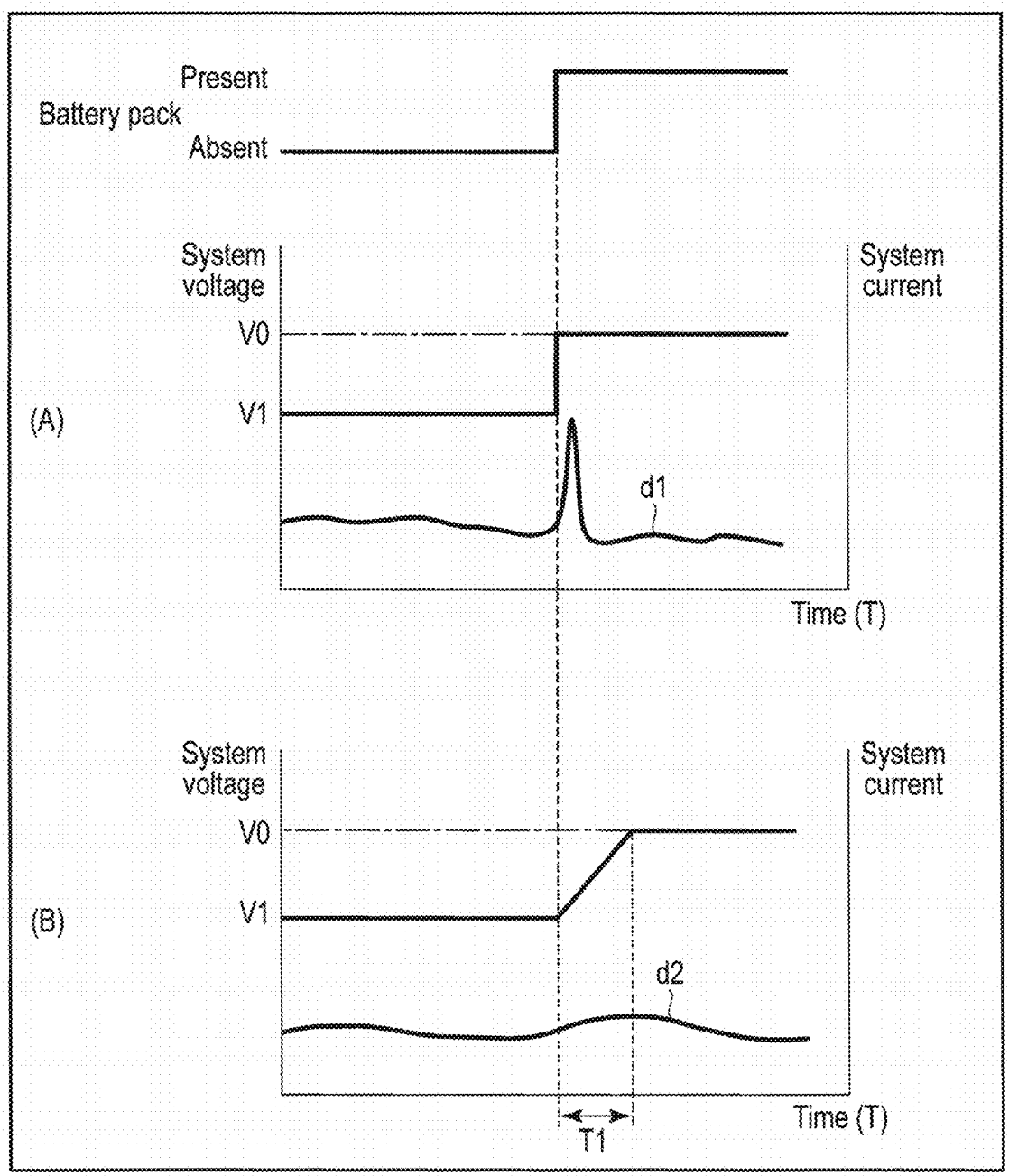
F I G. 12

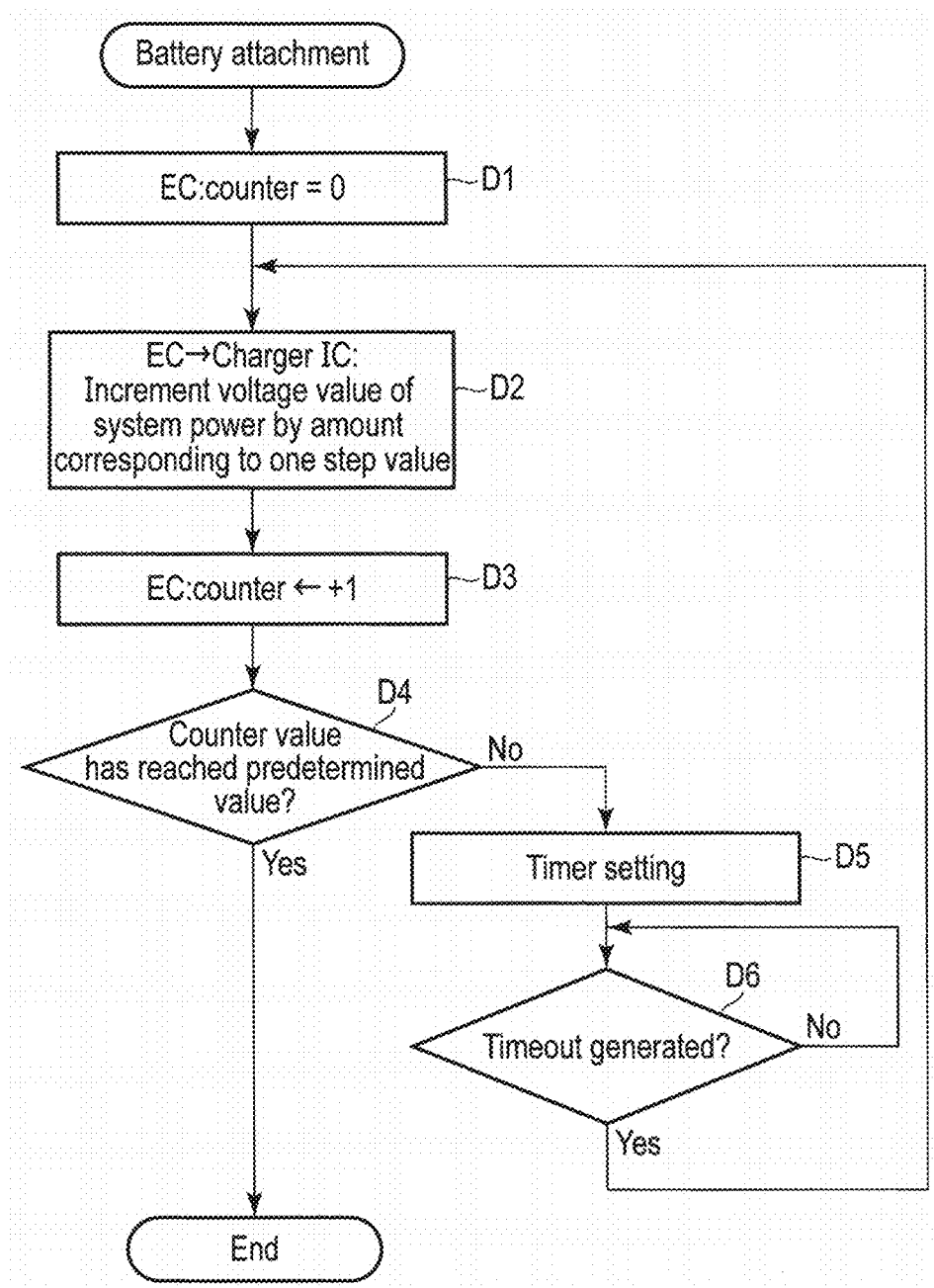
F I G. 13

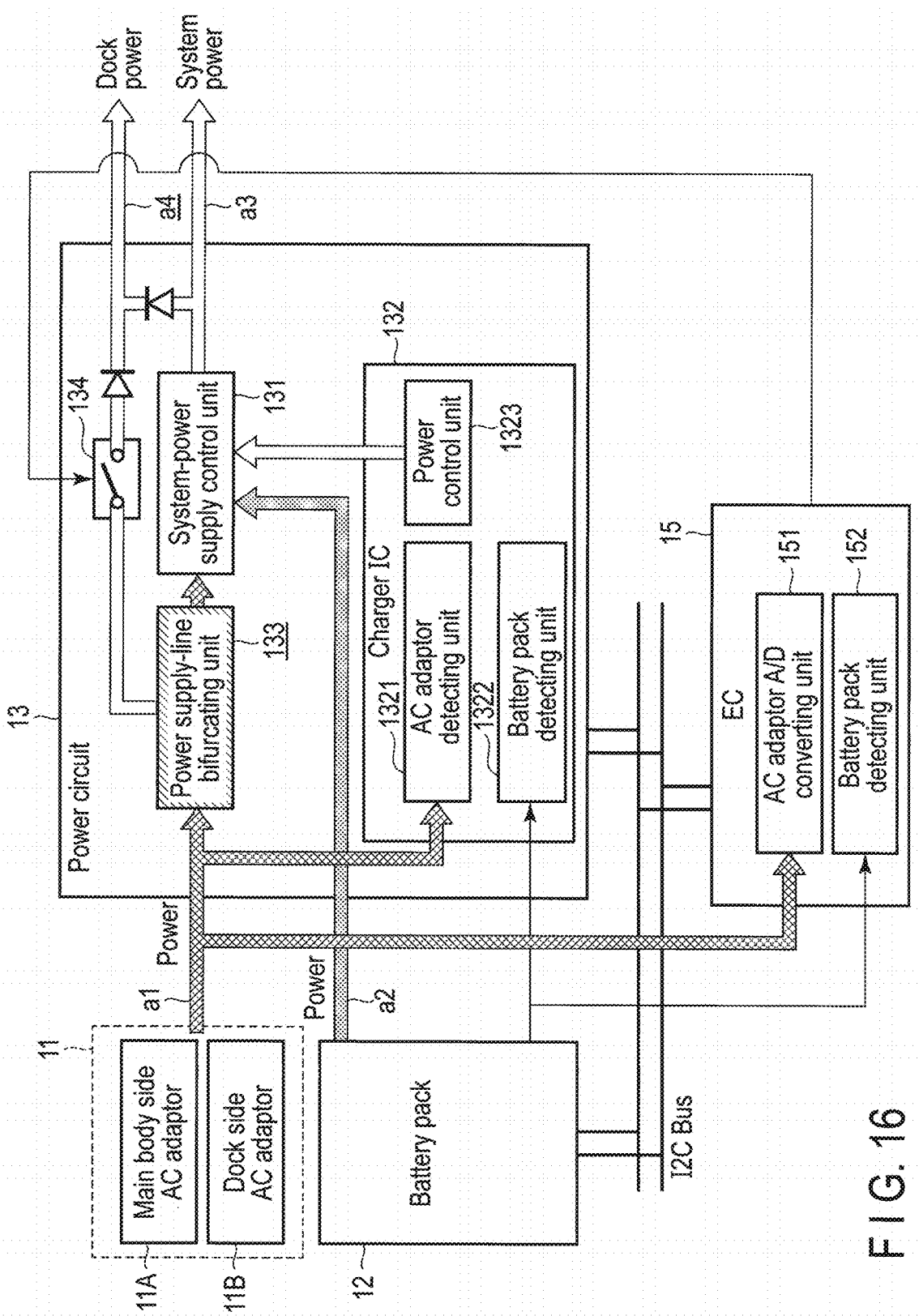
F I G. 16

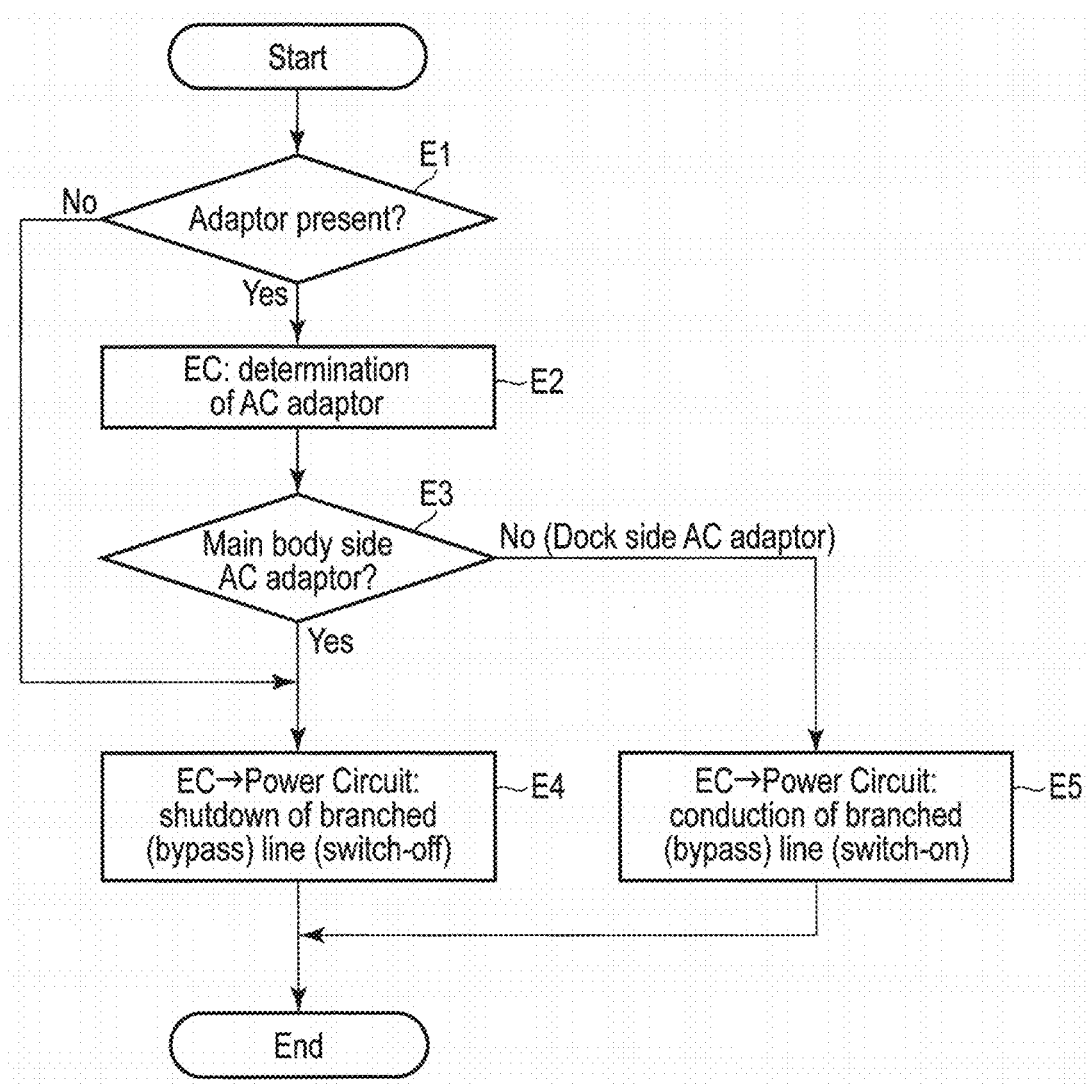
F I G. 17

ELECTRIC POWER SUPPLY SYSTEM

CROSS-REFERENCE TO RELATED APPLICATIONS

This application is based upon and claims the benefit of priority from Japanese Patent Application No. 2017-240780, filed Dec. 15, 2017, the entire contents of which are incorporated herein by reference.

FIELD

Embodiments described herein relate generally to an electric power supply system.

BACKGROUND

In recent years, battery-powered electronic apparatuses such as a notebook personal computer (PC), tablet PC, smartphone, and the like are variously utilized. An electronic apparatus of this kind is generally configured to be able to operate by power from either an AC adaptor or a battery.

Further, recently, an electric power supply architecture in which when power consumed by a load exceeds power from an AC adaptor, the shortfall is supplemented with power from a battery without exclusively and selectively using power from an AC adaptor or power from a battery is beginning to be widespread. As one of the electric power supply architectures of this kind, a Narrow VDC (NVDC) is known.

When an electric power supply system is constructed in accordance with the construction of the NVDC or the like which is an electric power supply architecture that can be dependent upon power from a battery even under circumstances where power is supplied from an AC adaptor, it is possible to cope with the event that the power consumed by the load exceeds the power from the AC adaptor, but on the other hand, measures or the like to cope with, for example, the event that the battery is removed under circumstances where power is supplied from the AC adaptor are newly required.

BRIEF DESCRIPTION OF THE DRAWINGS

A general architecture that implements the various features of the embodiments will now be described with reference to the drawings. The drawings and the associated descriptions are provided to illustrate the embodiments and not to limit the scope of the invention.

FIG. 1 is a view showing an example of a configuration of an electric power supply system of a first embodiment.

FIG. 6 is a view showing an example of setting of a current limit value to a charger IC performed by an embedded controller of an electric power supply system of a third embodiment.

FIG. 7 is a flowchart showing an example of an operation procedure of the electric power supply system of the third embodiment.

FIG. 11 is a flowchart showing an example of an operation procedure of the electric power supply system of the fourth embodiment.

FIG. 12 is a view showing transition of a system current of a case where the voltage value of the system power is restored to the specification value of the battery concomitantly with attachment of the battery of the electric power supply system of the fourth embodiment.

FIG. 13 is a flowchart showing an example of an operation procedure of an electric power supply system of a fifth embodiment.

FIG. 16 is a view showing an example of a configuration of an electric power supply system of a seventh embodiment.

FIG. 17 is a flowchart showing an example of an operation procedure of the electric power supply system of the seventh embodiment.

DETAILED DESCRIPTION

Figure 2:
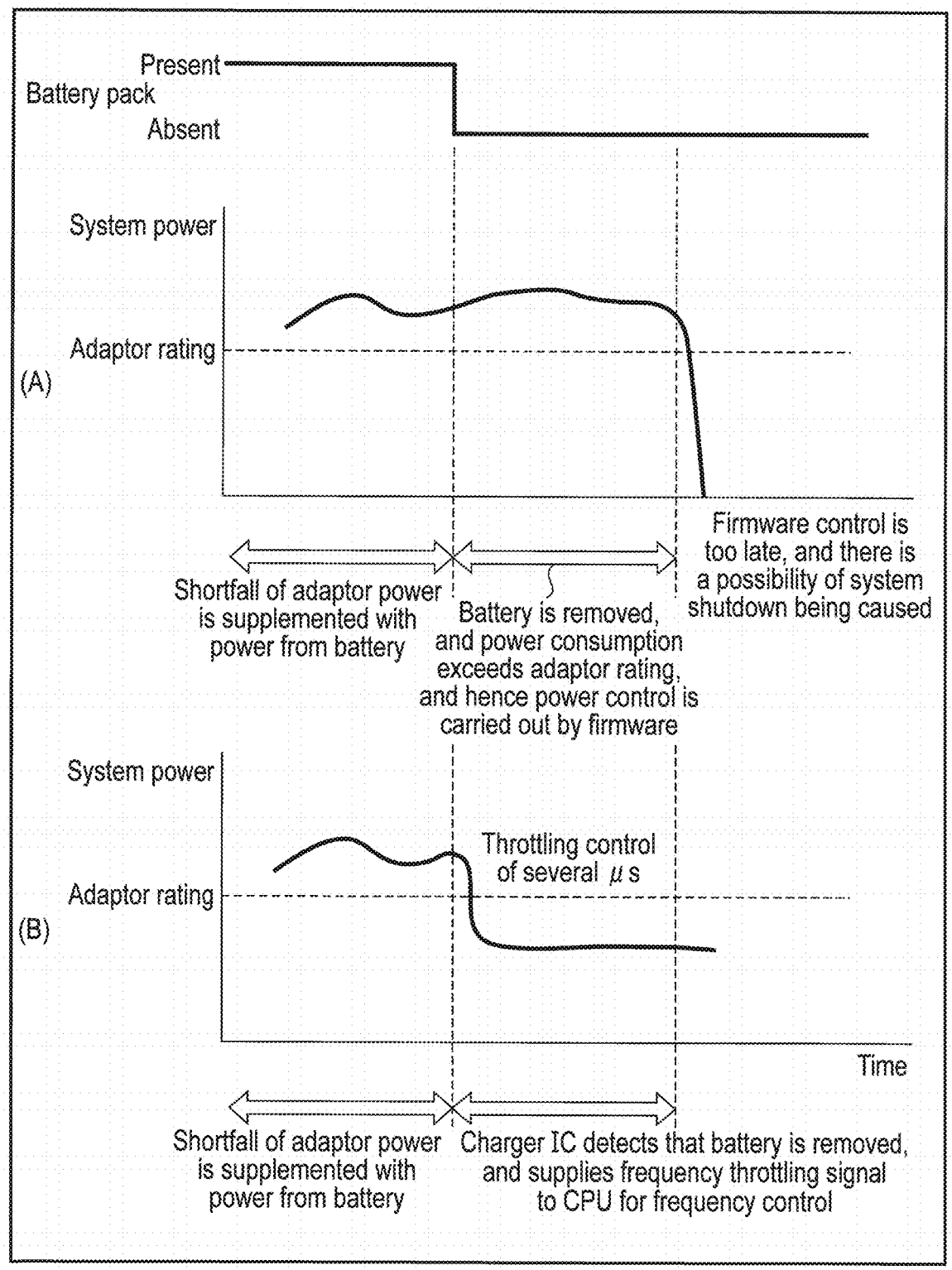
FIG. 2 is a view showing transition examples of a state associated with electric power in a case where a battery of the electric power supply system of the first embodiment is removed.

In general, according to one embodiment, an electric power supply system includes a processor, a power circuit and an embedded controller. The processor includes a first controller configured to modify an operating frequency of the processor and a second controller configured to modify an operating power of the processor. The power circuit detects a presence or an absence of a battery, creates a third power output to output to a load comprising the processor using a first power from an adaptor and a second power from the battery, and outputs the third power to the load comprising the processor. The embedded controller detects the presence or the absence of the battery at least partially in parallel with detection by the power circuit. The power circuit instructs the first controller to modify the operating frequency, and instructs the first controller to stop modifying the operating frequency according to an instruction from the embedded controller when the power circuit detects removal of the battery. The embedded controller causes the second controller to modify the operating power by notifying a Basic Input/Output System (BIOS) of removal of the battery when the embedded controller detects the removal of the battery, and instructs the power circuit to instruct the first controller to stop modifying the operating frequency of the processor after causing the second controller to modify the operating power. The BIOS includes a program executed by the processor.

Hereinafter, embodiments will be described with reference to the accompanying drawings.

First Embodiment

First, a first embodiment will be described below.

FIG. 1 is a view showing an example of a configuration of an electric power supply system (NVDC electric power supply system 1) of this embodiment.

The NVDC electric power supply system 1 adaptively uses both power (a1) from an AC adaptor 11 and power (a2) from a battery pack 12 to create and output system power (a3) for the load including a CPU 14. This NVDC electric power supply system 1 is applicable to any electronic apparatus if the electronic apparatus is an apparatus to which power can be supplied by use of an AC adaptor 11, and a battery pack 12 can be attached such as a notebook PC, tablet PC, smartphone, and the like. It should be noted that here a case where this NVDC electric power supply system 1 is applied to a notebook PC to/from which an extension unit (Dock) incorporating therein an Optical Disc Drive (ODD) can be freely attached/detached is assumed. Further, each of the notebook PC and extension unit includes a connector for connection to the AC adaptor 11 and, in a state where the extension unit is not attached to the notebook PC, the main body side AC adaptor 11A is connected to the connector of the notebook PC and, in a state where the extension unit is attached to the notebook PC, the Dock side AC adaptor 11B is connected to the connector of the extension unit. It should be noted that it is also possible to cause the main body side AC adaptor 11A be connected to the connector of the extension unit in the state where the extension unit is attached to the notebook PC. Here, it is assumed that the main body side AC adaptor 11A and Dock side AC adaptor 11B are different from each other in rating (supply rating). More specifically, the rating of the Dock side AC adaptor 11B regarding which it is conceivable that power is consumed by the ODD and the like is set larger than the rating of the main body side adaptor 11A. That is, in the NVDC electric power supply system 1, power is input from the plurality of AC adaptors 11 (11A and 11B) different from each other in rating. It should be noted that the power from the AC adaptor 11 is also used for charging of the battery pack 12.

As shown in FIG. 1, the NVDC electric power supply system 1 is realized by the cooperation of a power circuit 13, processor (Central Processing Unit (CPU)) 14, and embedded controller (EC) 15, and BIOS 16 which is a program executed by the CPU 14.

The power circuit 13 includes a system-power supply control unit 131, and charger IC 132.

The system-power supply control unit 131 of the power circuit 13 uses the power from the AC adaptor and power from the battery pack 12 to create and output the system power under the control of the charger IC 132. When the AC adaptor 11 is connected to the power circuit 13, and the battery pack 12 is attached to the power circuit 13, the voltage value of the system power is set to the full-charge voltage value of the battery pack 12. The voltage value of the system power may be changed by the setting of the charger IC 132 performed by the embedded controller 15.

The charger IC 132 is a module which controls charge and discharge of the battery pack 12. When the power consumed by the load exceeds the rating of the AC adaptor 11, the charger IC 132 performs control in such a manner that the shortfall is supplemented with power from the battery pack 12. The charger IC 132 includes an AC adaptor detecting unit 1321, battery pack detecting unit 1322, and power control unit 1323.

The AC adaptor detecting unit 1321 detects presence/absence of connection of the AC adaptor 11 and, more specifically, detects presence/absence of input of power from the AC adaptor 11. The AC adaptor detecting unit 1321 detects presence/absence of connection of the AC adaptor 11 according to, for example, a voltage value of a power-supply line for the AC adaptor 11 and, more specifically, according to presence/absence of an applied voltage thereof. The AC adaptor detecting unit 1321 does not perform determination of the AC adaptor 11. Further, the AC adaptor detecting unit 1321 detects a current value of power from the AC adaptor 11. The charger IC 132 monitors the current value and, when detecting that the power consumed by the load exceeds the rating of the AC adaptor 11, discharges the battery pack 12 to supplement the shortfall. The detection of the charger IC 132 is performed by monitoring whether or not the current value exceeds the current limit value set by the embedded controller 15. The charger IC 132, embedded controller 15, and battery pack 12 can communicate with each other through the I$^2$C bus, and the embedded controller 15 performs setting of the current limit value for the charger IC 132 by the communication through the I$^2$C bus.

The battery pack detecting unit 1322 detects presence/absence of attachment of the battery pack 12. The battery pack detecting unit 1322 monitors, for example, a signal line which is derived from the PC main body to the battery pack 12 when the battery pack 12 is attached to the PC main body, and which is pulled up by the battery pack 12 to detect presence/absence of attachment of the battery pack 12.

The power control unit 1323 performs various setting operations for the system-power supply control unit 131. As one of the setting items, a voltage value of the aforementioned system power to be output is included.

The CPU 14 includes a frequency control unit 141 and power control unit 142 with regard to the NVDC electric power supply system 1.

In response to the input of a frequency throttling signal via a predetermined input/output pin among a plurality of input/output pins provided in the CPU 14, the frequency control unit 141 performs first control for making the operating frequency of the CPU 14 the lowest frequency or for restoring the operating frequency from the lowest frequency to the normal frequency. The first control of the frequency control unit 141 can reduce the power consumption of the CPU 14 by shifting the operating frequency of the CPU 14 to the lowest frequency.

The power control unit 142 performs second control for operating the CPU 14 by the power set by the BIOS 16. More specifically, the CPU 14 has two operating modes including a normal mode and high-load mode, and the power control unit 142 controls the power consumption of the CPU 14 for each mode. The second control of the power control unit 142 can reduce the power consumption of the CPU 14 by limiting the power consumption of the CPU 14.

The embedded controller 15 includes an AC adaptor A/D converting unit 151 and battery pack detecting unit 152 with regard to the NVDC electric power supply system 1.

The embedded controller 15 digitizes the voltage value of the power from the AC adaptor 11 by use of the AC adaptor A/D converting unit 151. The embedded controller 15 determines based on the digitized value whether or not the AC adaptor 11 is connected, and determines the type of the AC adaptor 11, e.g., whether the AC adaptor 11 is the main body side AC adaptor 11A or the Dock side AC adaptor 11B.

The AC adaptor A/D converting unit 151 is a module unique to the embedded controller 15 of the NVDC electric power supply system 1, and how the embedded controller 15 utilizes the result of the determination of the type of the AC adaptor 11 based on the digitized value will be described in detail in another embodiment to be described later.

The battery pack detecting unit 152 detects presence/absence or attachment of the battery pack 12 as in the case of the battery pack detecting unit 1322 of the charger IC 132. When the battery pack 12 is attached to the PC, the embedded controller 15 can acquire the information about the remaining battery level of the battery pack 12 through the I²C bus.

With regard to the NVDC electric power supply system 1, the BIOS 16 includes a power setting unit 161. The power setting unit 161 performs setting for the power control unit 142 of the CPU 14 and, more specifically, sets the power consumption in each of the aforementioned normal mode and high-load mode.

Next, an example of an operation of the NVDC electric power supply system 1 of this embodiment having the aforementioned configuration in the case where the battery pack 12 thereof is removed will be described below.

Now a case where under the circumstances in which power from the AC adaptor 11 is input to the NVDC electric power supply system 1, and the battery pack 12 has been attached thereto, the battery pack 12 is removed is assumed. In this case, when the power exceeding the rating of the AC adaptor 11 is consumed by the load, the shortfall cannot be supplemented with the power from the battery pack 12, and hence there is a possibility of the system shutdown being caused by the exceeding of the rating of the AC adaptor 11.

Normally, in this case, the embedded controller which has detected the removal of the battery pack 12 by use of the battery pack detecting unit 152 notifies the BIOS 16 of an electric power saving setting event, and the power setting unit 161 of the BIOS 16 which has received the notification performs setting for controlling the CPU 14 in such a manner that the power consumption of the CPU 14 does not exceed the rating of the AC adaptor 11 for the power control unit 142 of the CPU 14.

Here, the issuance of the notification from the embedded controller 15 to the BIOS 16 is performed by, for example, the firmware (program) of the embedded controller 15 by supplying an interrupt signal to the CPU 14. Setting for the power control unit 142 of the CPU 14 performed by the firmware of the embedded controller 15 or by the program of the BIOS 16 or the like requires a predetermined length of time. Accordingly, when the battery pack 12 is removed, if power exceeding the rating of the AC adaptor 11 is consumed by the load or if power exceeding the rating of the AC adaptor 11 is consumed by the load before the setting for the power control unit 142 is performed, there is a possibility of the system shutdown being caused by the exceeding of the rating of the AC adaptor 11.

Thus, in the NVDC electric power supply system 1 of this embodiment, in parallel with the operation of the embedded controller 15, the charger IC 132 which has detected that the battery pack 12 is removed by use of the battery pack detecting unit 1322 provided in the power circuit 13 instructs the frequency control unit 141 of the CPU 14 to temporarily make the operating frequency of the CPU 14 the lowest frequency (a11 in FIG. 1). It should be noted that in parallel with the operation of the charger IC 132, setting for controlling the CPU 14 in such a manner that the power consumption of the CPU 14 does not exceed the rating of the AC adaptor 11 for the power control unit 142 of the CPU 14 by the firmware of the embedded controller 15 or by the program of the BIOS 16 or the like is also performed as usual (a12 and a13 in FIG. 1).

Upon receipt of this instruction, the frequency control unit 141 of the CPU 14 immediately makes the operating frequency of the CPU 14 the lowest frequency. Thereby, it is possible to securely prevent the system shutdown from being caused by the exceeding of the rating of the AC adaptor 11. On the other hand, continuing of the CPU 14 to operate at the lowest frequency causes, for example, deterioration or the like in the response to the user operation, and hence it is desirable that the operating frequency of the CPU 14 be restored to the original operating frequency after setting for controlling the CPU 14 in such a manner that the power consumption of the CPU 14 does not exceed the rating of the AC adaptor 11 is performed. Thus, upon receipt of a reply expressing that the setting has been completed from the BIOS 16 (a14 in FIG. 1), the embedded controller 15 instructs the charger IC 132 to cancel the control for limiting the operating frequency of the CPU 14 to the lowest frequency (a15 in FIG. 1). The charger IC 132 which has received the instruction instructs the frequency control unit 141 of the CPU 14 to restore the operating frequency of the CPU 14 to the original operating frequency (a16 in FIG. 1).

FIG. 2 is a view showing examples of transition of the state associated with power of a case where under the circumstances in which power from the AC adaptor 11 is input to the NVDC electric power supply system 1, and the battery pack 12 is attached thereto, the battery pack 12 is removed.

In FIG. 2, (A) indicates an example of transition of the state associated with power of a case where issuance of an instruction to temporarily make the operating frequency of the CPU 14 the lowest frequency to the frequency control unit 141 of the CPU 14 is not performed by the charger IC 132.

As indicated by (A) of FIG. 2, if the power exceeding the rating of the AC adaptor 11 is consumed by the load when the battery pack 12 is removed, the setting for performing control in such a manner that the power consumption does not exceed the rating of the AC adaptor 11 by a program such as the firmware of the embedded controller 15 or the BIOS 16 for the power control unit 142 of the CPU 14 is too late, and there is a possibility of the system shutdown being caused by the exceeding of the rating of the AC adaptor 11.

In FIG. 2, (B) indicates an example of transition of the state associated with power of a case where issuance of an instruction to temporarily make the operating frequency of the CPU 14 the lowest frequency to the frequency control unit 141 of the CPU 14 is performed by the charger IC 132.

As indicated by (B) of FIG. 2, even if the power exceeding the rating of the AC adaptor 11 is consumed by the load when the battery pack 12 removed, the frequency control unit 141 of the CPU 14 immediately makes the operating frequency of the CPU 14 the lowest frequency in response to an instruction from the charger IC 132, whereby the rating of the AC adaptor 11 is prevented from being exceeded.

Figure 3:
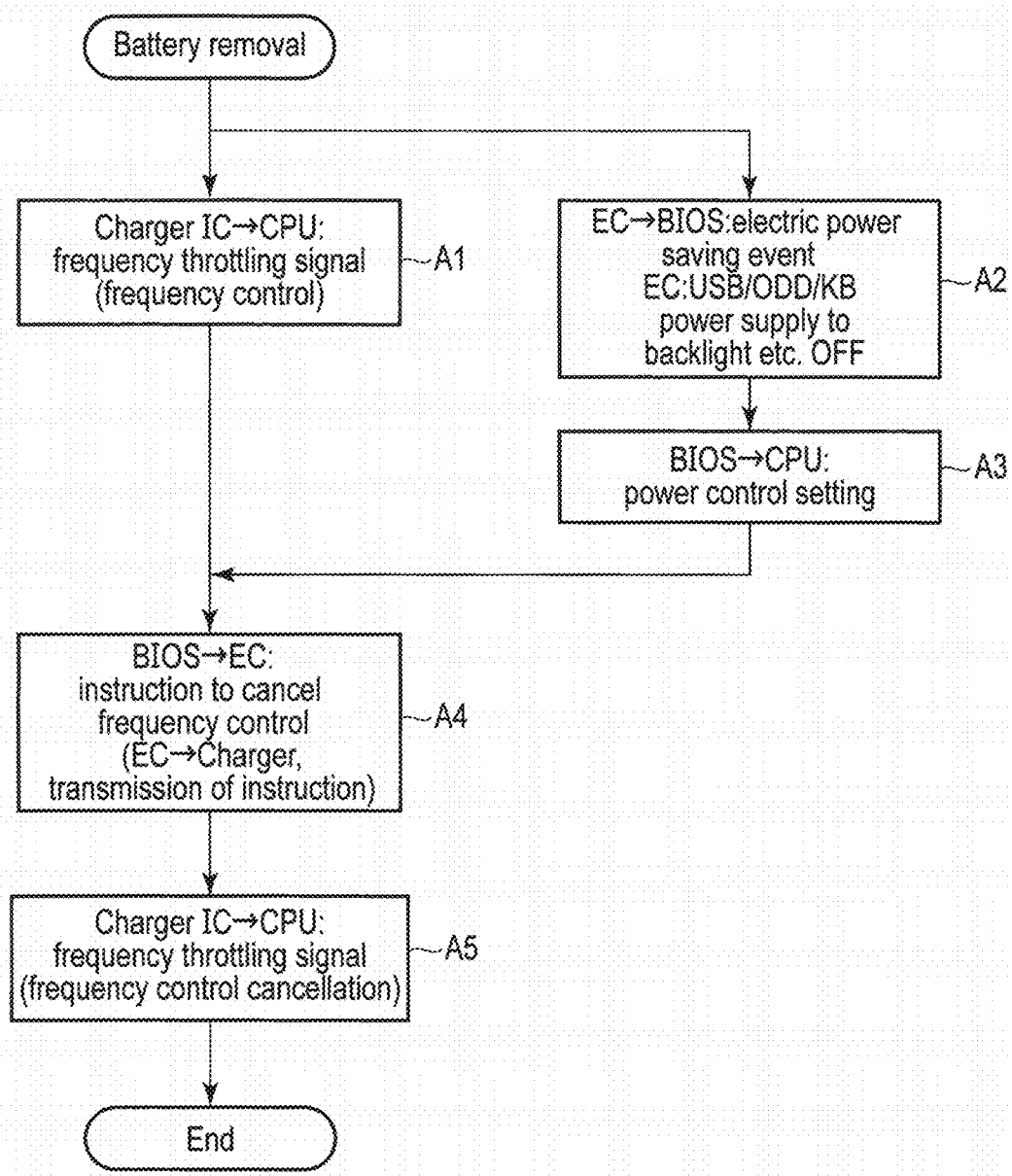
FIG. 3 is a flowchart showing an example of an operation procedure of the electric power supply system of the first embodiment.

FIG. 3 is a flowchart showing an example of an operation procedure of the NVDC electric power supply system 1 of this embodiment.

When the battery pack 12 is removed, the charger IC 132 instructs the CPU 14 to temporarily make the operating frequency thereof the lowest frequency (step A1). In parallel with the operation of the charger IC 132, the embedded controller 15 notifies the BIOS 16 of an electric power saving setting event (step A2). Then, the BIOS 16 which has received the notification from the embedded controller 15 performs setting for causing the power consumption not to exceed the rating of the AC adaptor 11 for the CPU 14 (step A3).

Upon completion of the setting for the CPU 14, the BIOS 16 instructs the embedded controller 15 to cancel the temporarily set limitation of the operating frequency of the CPU 14 (step A4). This instruction is transmitted from the embedded controller 15 to the charger IC 132 through the I²C bus. The charger IC 132 instructs the CPU 14 to restore the operating frequency thereof to the original operating frequency (step A5).

As described above, the NVDC electric power supply system 1 of this embodiment realizes the safe and efficient use of power from the AC adaptor and power from the battery.

Second Embodiment

Next, a second embodiment will be described below.

It is assumed that the configuration of an NVDC electric power supply system 1 of this embodiment is identical to the first embodiment (see FIG. 1).

In the first embodiment, when the battery pack 12 is removed, the charger IC 132 instructs the CPU 14 to operate at the lowest frequency, whereby the system shutdown is prevented from being caused by the exceeding of the rating of the AC adaptor 11 until setting of the CPU 14 for preventing the power consumption from exceeding the rating of the AC adaptor 11 is completed. Conversely, the NVDC electric power supply system 1 of this embodiment prevents the system shutdown from being caused by the exceeding of the rating of the AC adaptor 11 even when the remaining battery level of the battery pack 12 falls below a threshold in addition to when the battery pack 12 is removed as will be described below. It should be noted that the temporary limitation of the operating frequency of the CPU 14 by the charger IC 132 described in the first embodiment may also be performed at the same time.

As described in the first embodiment, the embedded controller 15 can detect presence/absence of connection of the AC adaptor 11 by use of a voltage value of the power from the AC adaptor 11 digitized by the AC adaptor A/C converting unit 151. Further, the embedded controller 15 can detect presence/absence of attachment of the battery pack 12 by use of the battery pack detecting unit 152. Furthermore, when the battery pack 12 is attached, the embedded controller 15 can acquire information about the remaining battery level of the battery pack 12 through the I²C bus.

When the battery pack 12 is removed or when the remaining battery level of the battery falls below the threshold, the embedded controller 15 in the NVDC electric power supply system 1 of this embodiment notifies the BIOS 16 of an electric power saving setting event, and shuts down the supply of power to the USB device, ODD, keyboard backlight, and the like even when the AC adaptor 11 is connected.

The shutdown of the power supply to the USB device, ODD, keyboard backlight, and the like by the embedded controller 15 is performed within a sufficiently short period of time as compared with the setting for the CPU 14, which is performed through the route from the embedded controller 15 to the BIOS 16 and to the CPU 14, for causing the power consumption not to exceed the rating of the AC adaptor 11, and hence it is possible to prevent the system shutdown from being caused by the exceeding of the rating of the AC adaptor 11.

Figures 4, 5:
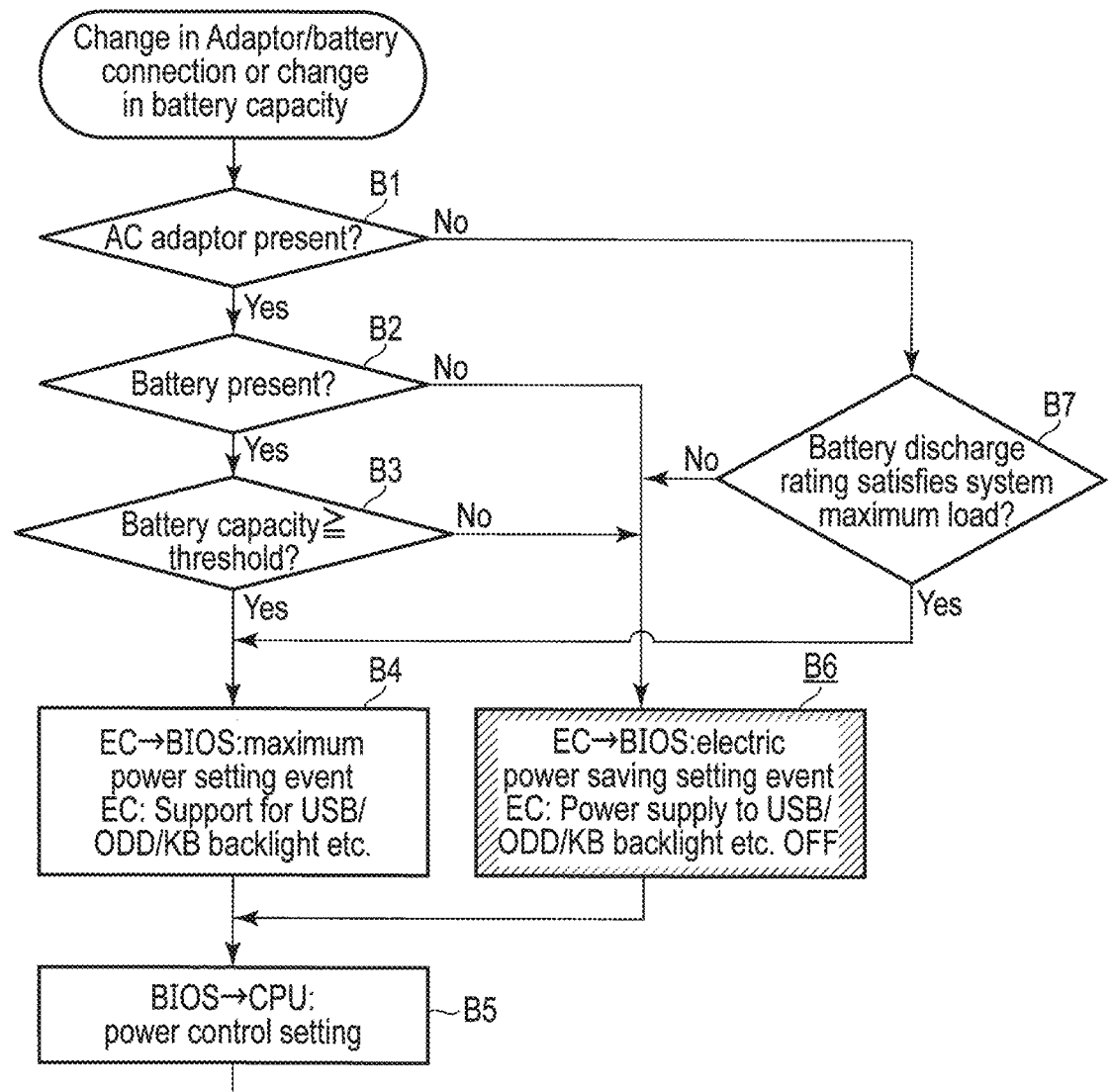
FIG. 4 is a view showing an example of setting associated with the power consumption of the CPU by the BIOS of an electric power supply system of a second embodiment.
FIG. 5 is a flowchart showing an example of an operation procedure of the electric power supply system of the second embodiment.

FIG. 4 is a view showing an example of setting for the power control unit 142 of the CPU 14 by the BIOS 16 which has received the notification of the electric power saving setting event from the embedded controller 15 by use of the power setting unit 161.

As described in the first embodiment, the CPU 14 has two operating modes including a normal mode and high-load mode. The continuous mode in FIG. 4 indicates the power consumption of the CPU 14 at the time of the normal mode, and the peak mode indicates the power consumption of the CPU 14 at the time of the high-load mode. In other words, the power control unit 142 controls the CPU 14 in such a manner that the CPU 14 operates by the power indicated by the continuous mode at the time of the normal mode, and controls the CPU 14 in such a manner that the CPU 14 operates by the power indicated by the peak mode at the time of the high-load mode. It should be noted that the period of time within which the CPU 14 can continuously operate in the high-load mode is limited.

As shown in FIG. 4, when the AC adaptor 11 is connected, the battery pack 12 is attached, and the remaining battery level of the battery pack 12 is higher than or equal to the threshold, the BIOS 16, more specifically, the power setting unit 161 sets the continuous mode to the normal power, and sets the peak mode to the peak power. Assuming that the power from the AC adaptor 11 is power of such a degree that the power is somewhat higher than the peak power, the power is also consumed by the load other than the CPU 14, and hence when the CPU 14 operates in the high-load mode, there is a strong possibility of power from the battery pack 12 being allocated for the operation. It should be noted that when the battery pack 12 is attached, and the remaining battery level thereof is higher than or equal to the threshold or the remaining battery level of the battery pack 12 has been restored to a value higher than or equal to the threshold, the embedded controller 15 notifies the BIOS 16 of a maximum power setting event, and the BIOS 16 takes the opportunity of receiving the notification to perform the setting operations.

On the other hand, when the battery pack 12 is removed or when the remaining battery level of the battery pack 12 falls below the threshold, the BIOS 16 takes the opportunity of receiving the notification of the electric power saving setting event from the embedded controller 15 to set the continuous mode to the minimum power (minimum power<normal power), and set the peak mode also to the minimum power. Thereby, even when the CPU 14 operates in the high-load mode, the power consumption falls within the range of the power from the AC adaptor 11, and hence the system shutdown is never caused by the exceeding of the rating of the AC adaptor 11.

FIG. 5 is a flowchart showing an example of an operation procedure of the NVDC electric power supply system 1 of this embodiment. This flowchart shows the operation procedures of the embedded controller 15 and BIOS 16 in the case where a change in the connection (attachment) state of the AC adaptor 11 or the battery pack 12 or a change in the capacity of the battery pack 12 has occurred.

The embedded controller 15 determines presence/absence of connection of the AC adaptor 11 (step B1). When the AC adaptor 11 is connected (YES in step B1), the embedded controller 15 determines this time presence/absence of attachment of the battery pack 12 (step B2). When the battery pack 12 is attached (YES in step B2), the embedded controller 15 subsequently determines whether or not the remaining battery level of the battery pack 12 is higher than or equal to the threshold (step B3).

When the remaining battery level of the battery pack 12 is higher than or equal to the threshold (YES in step B3), the embedded controller 15 notifies the BIOS 16 of a maximum power setting event (step B4). Further, at this time, the embedded controller 15 performs control in such a manner that supply of power to the USB device, ODD, keyboard backlight, and the like is performed. The BIOS 16 which has received the notification of the maximum power setting event from the embedded controller 15 sets power consumption in each mode to the CPU 14, more specifically, to the power control unit 142 (step B5).

When the battery pack 12 is removed (NO in step B2) or when the remaining battery level of the battery pack 12 falls below the threshold (NO in step B3), the embedded controller 15 notifies the BIOS 16 of an electric power saving setting event (step B6). Further, at this time, the embedded controller 15 shuts down the supply of power to the USB device, ODD, keyboard backlight, and the like. The BIOS 16 which has received the notification of the maximum power setting event from the embedded controller 15 sets power consumption in each mode to the CPU 14.

When the AC adaptor 11 is not connected (NO in step B1), the embedded controller 15 determines whether or not the discharge rating of the battery pack 12 satisfies the system maximum load (step B7). This determination is performed based on, for example, whether or not the discharge rating of the battery pack 12 acquired by the communication through the I$^2$C bus is greater than or equal to a predetermined value. When the discharge rating of the battery pack 12 does not satisfy the system maximum load (NO in step B7), the embedded controller 15 notifies the BIOS 16 of an electric power saving setting event (step B6). Further, at this time, the embedded controller 15 shuts down the supply of power to the USB device, ODD, keyboard backlight, and the like. The BIOS 16 which has received the notification of the maximum power setting event from the embedded controller 15 sets power consumption in each mode to the CPU 14. When the discharge rating of the battery pack 12 satisfies the system maximum load (YES in step B7), the embedded controller 15 notifies the BIOS 16 of a maximum power setting event (step B4). Further, at this time, the embedded controller 15 performs control in such a manner that the supply of power to the USB device, ODD, keyboard backlight, and the like is performed. The BIOS 16 which has received the notification of the maximum power setting event from the embedded controller 15 sets power consumption in each mode to the CPU 14 (step B5).

As described above, the NVDC electric power supply system 1 of this embodiment realizes the safe and efficient use of power from the AC adaptor and power from the battery.

Third Embodiment

Next, a third embodiment will be described below.

It is assumed that the configuration of an NVDC electric power supply system 1 of this embodiment is identical to the first embodiment (see FIG. 1).

As described in the first embodiment, the charger IC 132 detects a current value of power from the AC adaptor 11 by use of the AC adaptor detecting unit 1321, and monitors whether or not the current value exceeds the current limit value set by the embedded controller 15. When the current value exceeds the current limit value, i.e., when the load consumes power exceeding the rating of the AC adaptor 11, the charger IC 132 discharges the battery pack 12 to supplement the shortfall.

Incidentally, in the NVDC electric power supply system 1 to which power from a plurality of AC adaptors 11A and 11B different from each other in rating can be input, if the current limit value is determined by using, for example, the AC adaptor 11A having the lower rating as a criterion, when the AC adaptor 11B having the higher rating is connected, there is a possibility of essentially unnecessary discharge of the battery pack 12 being performed.

Further, as described also in the first embodiment, based on a voltage value of the power from the AC adaptor 11 digitized by the AC adaptor A/D converting unit 151, the embedded controller 15 determines presence/absence of connection of the AC adaptor 11, and the type of the AC adaptor 11, e.g., whether the AC adaptor 11 is the main body side AC adaptor 11A or the Dock side AC adaptor 11B.

Thus, in the NVDC electric power supply system 1 of this embodiment, the embedded controller 15 which determines the type of the AC adaptor 11 switches the current limit value to be used in the charger IC 132 according to the type of the AC adaptor 11.

FIG. 6 is a view showing an example of setting to the charger IC 132 performed by the embedded controller 15 which determines the type of the AC adaptor 11.

In FIG. 6, the current limit 1 indicated by a reference symbol c1 is the current limit value and, when, for example, the main body side AC adaptor 11A having a rating of 45 W is connected, the embedded controller 15 sets a current limit value for 45 W. Further, when, for example, the Dock side AC adaptor 11B having a rating of 120 W or 180 W is connected, the embedded controller 15 sets a current limit value for 170 W or 180 W.

FIG. 7 is a flowchart showing an example of an operation procedure of the NVDC electric power supply system 1 of this embodiment.

The embedded controller 15 determines the connected AC adaptor 11 (step C1). When the AC adaptor 11 is the main body side AC adaptor 11A (YES in step C2), the embedded controller 15 sets the current limit value for the main body side AC adaptor 11A to the charger IC 132 (step C3). When the AC adaptor 11 is the Dock side AC adaptor 11B, the embedded controller 15 sets the current limit value for the Dock side AC adaptor 11B to the charger IC 132 (step C4).

It should be noted that, here, although an example in which one of the two current limit values is selected is shown, the embedded controller 15 can determine three or more types of AC adaptors 11 based on a voltage value of power from the AC adaptor 11 digitized by the AC adaptor A/D converting unit 151, and hence one of three or more current limit values may also be selected.

As described above, the NVDC electric power supply system 1 of this embodiment realizes the safe and efficient use of power from the AC adaptor and power from the battery.

Fourth Embodiment

Next, a fourth embodiment will be described below.

Figure 8:
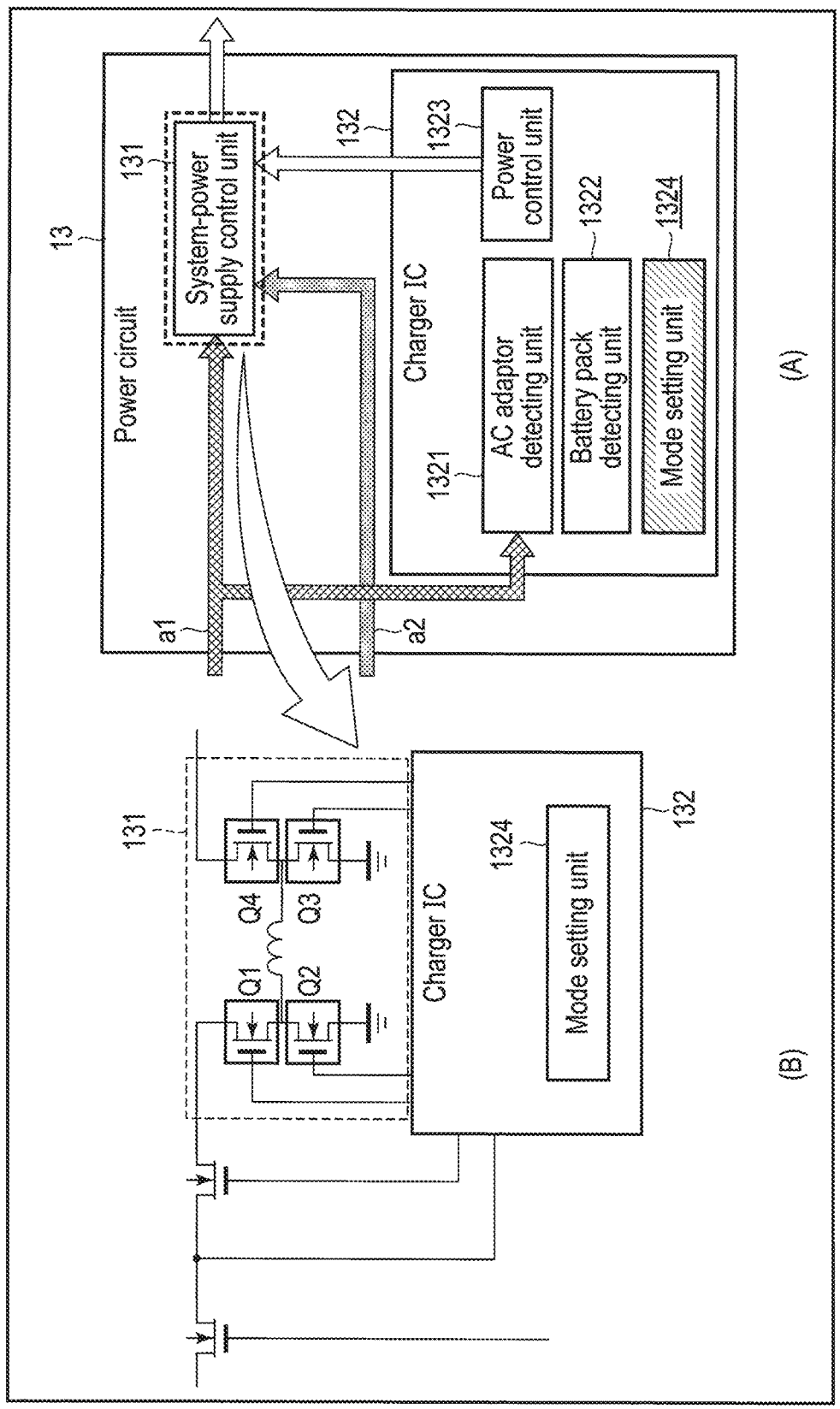
FIG. 8 is a view showing an example of a configuration of a system power control section in an electric power supply system of a fourth embodiment.

FIG. 8 is a view showing a configuration example of each of the system-power supply control unit 131 and charger IC 132 provided in the NVDC electric power supply system 1 of this embodiment.

In FIG. 8, (A) indicates an example of the configuration of the power circuit 13, and (B) indicates an example of the configuration of the system-power supply control unit 131 in the power circuit 13.

As shown in (A) of FIG. 8, in the NVDC electric power supply system 1 of this embodiment, the charger IC 132 in the power circuit 13 further includes a mode setting unit 1324. Further, as shown in (B) of FIG. 8, in the system-power supply control unit 131, a step-up/step-down DD converter is constituted of four FETs (Q1, Q2, Q3, and Q4) to be turned on/off by the charger IC 132. It should be noted that in also the system-power supply control unit 131 in the NVDC electric power supply system 1 of each of the first to third embodiments, a step-up/step-down DD converter identical to that described above is constituted.

As described in the first embodiment, the system-power supply control unit 131 of the power circuit 13 uses the power from the AC adaptor 11 and power from the battery pack 12 to create and output the system power under the control of the charger IC 132. Further, when the AC adaptor 11 is connected, and the battery pack 12 is attached, the voltage value of the system power is set to the full-charge voltage value of the battery pack 12.

For example, when the voltage value of power from the AC adaptor 11 is greater than the full-charge voltage value of the battery pack 12, and the voltage value of the system power is set to the full-charge voltage value of the battery pack 12, it is assumed that the charger IC 132, more specifically, the power control unit 1323 operates the step-up/step-down DD converter of the system-power supply control unit 131 in the step-up/down mode in which the four FETs operate at all times while repeating an on/off action. In the step-up/down mode, the power supply efficiency is lowered by the power consumption of the step-up/step-down DD converter, more specifically, the four FETs.

Thus, in the NVDC electric power supply system 1 of this embodiment, paying attention to the fact that when the battery pack 12 is not attached, the voltage value of the system power may not be set to the full-charge voltage value of the battery pack 12, the charger IC 132 switches, under the control of the embedded controller 15, the operation of the step-up/step-down DD converter of the system-power supply control unit 131 to the step-down mode in which operations of two FETs among the four FETs are stopped, e.g., the FET Q3 is fixed to the off-state, and FET Q4 is fixed to the on-state. It is assumed that, for example, when the voltage value of the system voltage is set to a value less than the full-charge voltage value of the battery pack 12, the charger IC 132 operates the step-up/step-down DD converter of the system-power supply control unit 131 in the step-down mode. That is, the embedded controller 15 notifies the charger IC 132 of an instruction to switch the voltage value of the system power from the full-charge voltage value of the battery pack 12 to a value less than the full-charge voltage value of the battery pack 12, i.e., an instruction to set a value less than the full-charge voltage value of the battery pack 12, whereby it is possible to switch the step-up/step-down DD converter of the system-power supply control unit 131 from the step-up/down mode to the step-down mode. Based on a voltage value of the system voltage notified by the embedded controller 15, the mode setting unit 1324 determines in which of the step-up/down mode and step-down mode the step-up/step-down DD converter of the system-power supply control unit 131 should be operated. The power control unit 1323 operates the step-up/step-down DD converter of the system-power supply control unit 131 in the step-up/down mode or step-down mode determined by the mode setting unit 1324.

As described above, it is dared not to make the voltage value of the system voltage coincident with the full-charge voltage value of the battery pack 12, the voltage value of the system voltage is intentionally shifted from the full-charge voltage value of the battery pack 12 to, for example, a value less than the full-charge voltage value of the battery pack 12, the mode is switched from the step-up/down mode to the step-down mode, and operations of two FETs among the four BETS are stopped, whereby it is possible to reduce the power consumed by the step-up/step-down DD converter of the system-power supply control unit 131, and raise the power supply efficiency.

Figures 9, 10:
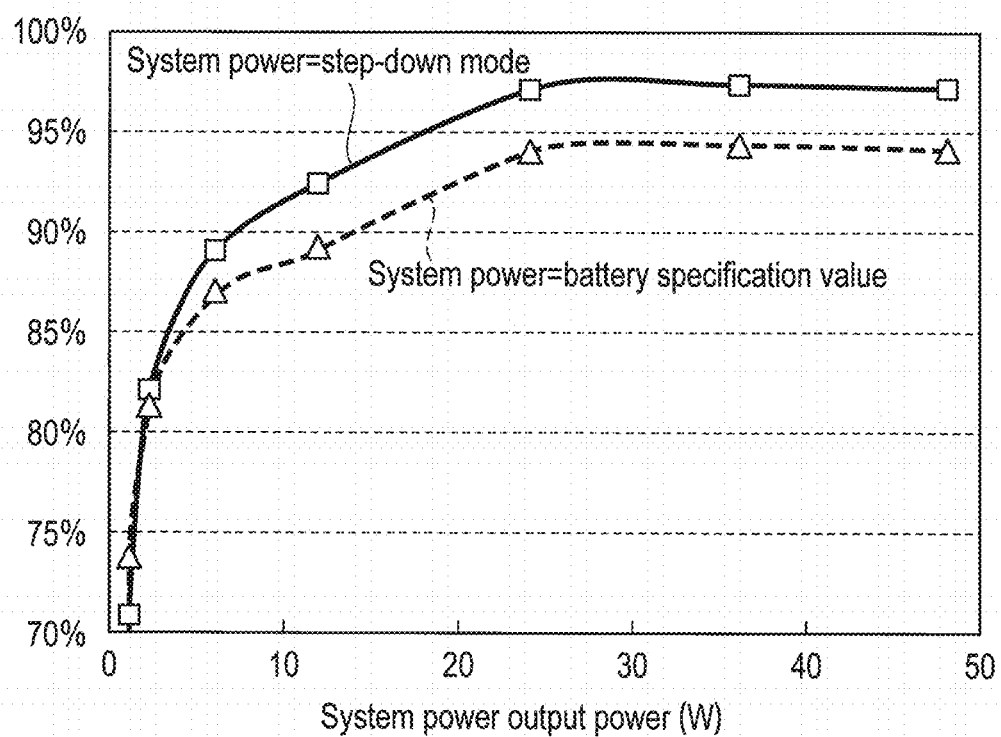
FIG. 9 is a view showing an example of setting of a system power voltage value to a charger IC by an embedded controller of the electric power supply system of the fourth embodiment.
FIG. 10 is a view showing the power supply efficiency of each voltage value of the system power of the electric power supply system of the fourth embodiment.

FIG. 9 is a view showing an example of setting of a system power voltage value for the charger IC 132 which controls the step-up/step-down DD converter in the system-power supply control unit 131 by the embedded controller 15.

The system power in FIG. 9 indicates the system power to be created and output by the power circuit 13.

As shown in FIG. 9, when the battery pack 12 is attached, the embedded controller 15 sets the voltage value of the system power to a battery specification value and, more specifically, to a full-charge voltage value of the battery pack 12. On the other hand, when the battery pack 12 is not attached, the embedded controller 15 intentionally shifts the voltage value of the system power from the full-charge voltage value of the battery pack 12, and sets the voltage value of the system power to a voltage value at which the step-up/step-down DD converter of the system-power supply control unit 131 operates in the step-down mode.

FIG. 10 is a view showing the power supply efficiency of a case where under the circumstances in which the battery pack 12 is not attached, the voltage value of the system power is set to the battery specification value, i.e., to a value at which the step-up/step-down DD converter of the system-power supply control unit 131 operates in the step-up/down mode, and power supply efficiency of a case where the voltage value of the system power is set to a value intentionally shifted from the battery specification value, i.e., to a value at which the step-up/step-down DD converter of the system-power supply control unit 131 operates in the step-down mode.

As shown in FIG. 10, the power supply efficiency becomes higher in the case where the voltage value of the system power is set to a voltage value within the range of the step-down mode as compared with the case where the voltage value of the system power is set to the full-charge voltage value of the battery pack 12 irrespective of the power consumption of the load.

FIG. 11 is a flowchart showing an example of an operation procedure of the NVDC electric power supply system 1 of this embodiment. This flowchart shows the operation procedures of the embedded controller 15 and BIOS 16 in the case where a change in the connection (attachment) state of the AC adaptor 11 or the battery pack 12 or a change in the capacity of the battery pack 12 has occurred.

In FIG. 11, steps B1 through B7 are identical to the second embodiment, and hence their descriptions are omitted (see FIG. 5). In the NVDC electric power supply system 1 of this embodiment, when the AC adaptor 11 is connected (YES in step B1), and the battery pack 12 is not attached (NO in step B2), the embedded controller 15 sets a high-efficiency mode to the charger IC 132 (step B8). Setting of the high-efficiency mode means setting the voltage value of the system power to the voltage value at which the step-up/step-down DD converter of the system-power supply control unit 131 operates in the step-down mode described above. By this setting, the charger IC 132 operates the step-up/step-down DD converter of the system-power supply control unit 131 in the step-down mode in which operations of two FETs among four FETs are stopped.

As described above, the NVDC electric power supply system 1 of this embodiment realizes the safe and efficient use of power from the AC adaptor and power from the battery.

Fifth Embodiment

Next, a fifth embodiment will be described below.

In the fourth embodiment, when the battery pack 12 is removed, it is dared not to make the voltage value of the system voltage coincident with the battery specification value, i.e., the full-charge voltage value of the battery pack 12, and the voltage value of the system power is intentionally shifted to the voltage value at which the step-up/step-down DD converter of the system-power supply control unit 131 operates in the step-down mode in which operations of two FETs among four FETs are stopped, whereby the power supply efficiency is raised.

When the battery pack 12 which has been separate from the NVDC electric power supply system 1 is attached thereto again, the voltage value of the system voltage is set to the battery specification value, i.e., to the full-charge voltage value of the battery pack 12 again. For exam-ple, when switching of enhancing the voltage value from a voltage value within the range of the step-down mode to the full-charge voltage value of the battery pack 12 is performed, a rush current flows, and there is a possibility of the load side being damaged by the overcurrent.

Thus, in the NVDC electric power supply system 1 of this embodiment, when the battery pack 12 is attached on the assumption that the voltage value of the system voltage is lowered at the time of removal of the battery pack 12, the rush current is prevented from flowing. It should be noted that it is assumed that the configurations of the system-power supply control unit 131 and charger IC 132 provided in the power circuit 13 of the NVDC electric power supply system 1 of this embodiment are identical to the fourth embodiment (see FIG. 8).

As described in the first embodiment, the embedded controller 15 can detect removal or attachment of the battery pack 12 by use of the battery pack detecting unit 152. Upon detection of attachment of the battery pack 12, the embedded controller 15 performs setting to the charger IC 132 to restore the voltage value of the system voltage set for operating the step-up/step-down DD converter of the system-power supply control unit 131 in the step-up mode to the specification value of the battery pack 12, i.e., the full-charge voltage value of the battery pack 12. At this time, the embedded controller 15 does not abruptly change the system voltage value, and changes the system voltage value in, for example, a stepwise manner. For example, the embedded controller 15 controls the charger IC 132 in such a manner that the system voltage value is gradually raised in a stepwise manner by an amount of a voltage value (V0–V1 (V)) corresponding to a difference between a predetermined voltage value (V1 (V)) for convenience' sake) of the system set at the time of removal of the battery pack 12 and a voltage value (V0 (V) for convenience' sake) which is the specification value of the battery pack 12 by incrementing the system voltage value several times at certain periodic intervals by an amount for each time obtained by dividing the above voltage value corresponding to the difference into several fixed voltage values.

FIG. 12 is a view showing transition of the current value of the system power of a case where the voltage value of the system power is restored to the specification value of the battery pack 12 concomitantly with attachment of the battery pack 12.

In FIG. 12, (A) indicates transition of the current value (d1) of the system power of a case where the voltage value of the system power is instantly restored to the specification value of the battery pack 12, and (B) indicates transition of the current value (d2) of the system power of a case where the voltage value of the system power is restored to the specification value of the battery pack 12 in, for example, a stepwise manner.

As shown in (A) of FIG. 12, when the voltage value of the system power is instantly restored to the specification value of the battery pack 12, there is a possibility of a rush current flowing. Conversely, as shown in (B) of FIG. 12, when the voltage value of the system power is restored to the specification value of the battery pack 12 in a stepwise manner, the rush current can be prevented from flowing.

Further, regarding the restoration of the voltage value of the system power to the voltage V0 in a predetermined period of time (T1) after attachment of the battery pack 12, the restoration may be stepwise as described previously or the voltage value may be linearly raised.

FIG. 13 is a flowchart showing an example of an operation procedure of the NVDC electric power supply system 1 of this embodiment. This flowchart shows the operation procedure of the embedded controller 15 in the case where the battery pack 12 is attached.

First, the embedded controller initializes the counter value to 0 (step D1). After initializing the counter value to 0, the embedded controller 15 sets a voltage value obtained by incrementing the voltage value of the power circuit 13 at that point in time by an amount corresponding to one step value to the charger IC 131 of the power circuit 13 as the voltage value of the system power (step D2). After performing this setting, the embedded controller 15 increments the counter value by 1 (step D3).

The embedded controller 15 determines whether or not the counter value after being incremented by 1 has reached a predetermined value (step D4) and, when the value has not reached the predetermined value (NO in step D4), the embedded controller 15 sets a timer for securing a time interval (step D5). When the timer generates a timeout (YES in step D6), the embedded controller 15 returns to step D2 and increments the voltage value of the system power by an amount corresponding to one step value. When the counter value has reached the predetermined value (YES in step D4), the embedded controller 15 terminates the restoration processing of the voltage value of the system power concomitant with the attachment of the battery pack 12.

As described above, the NVDC electric power supply system 1 of this embodiment realizes the safe and efficient use of power from the AC adaptor and power from the battery.

Sixth Embodiment

Next, a sixth embodiment will be described below.

In the NVDC electric power supply system 1 of this embodiment, the mode setting unit 1324 of the aforementioned fourth embodiment further adds a fixed mode in which switching is not performed to the DD converter of the system-power supply control unit 131, the DD converter being performed step-up/step-down switching in the normal mode. For example, when the battery pack 12 is not attached, the FETs Q1 and Q4 are fixedly kept in the on-state at all times at all times, and the FETs Q2 and Q3 are fixedly kept in the off-state, whereby the embedded controller 15 performs control in such a manner that switching is not performed. As described above, in the sixth embodiment, a mode setting unit 1325 which enables switching (load switch mode) to the fixed mode is incorporated in the charger IC 132.

Switching of the DD converter of the system-power supply control unit 131 to the fixed mode is performed by the embedded controller 15 through the power control unit 1323 in the charger IC 132. At this time, the embedded controller 15 can perform switching control for the charger IC 132 by using the mode pin for switching or wireless communication.

As described above, in the state where the battery pack 12 is not attached, the step-up/step-down DD converter of the system-power supply control unit 131 is shifted to the load switch mode, and the step-up/step-down operation of the step-up/step-down DD converter is not performed, whereby it is possible to eliminate the switching loss, and further improve the power supply efficiency as compared with the fourth embodiment.

Figures 14, 15:
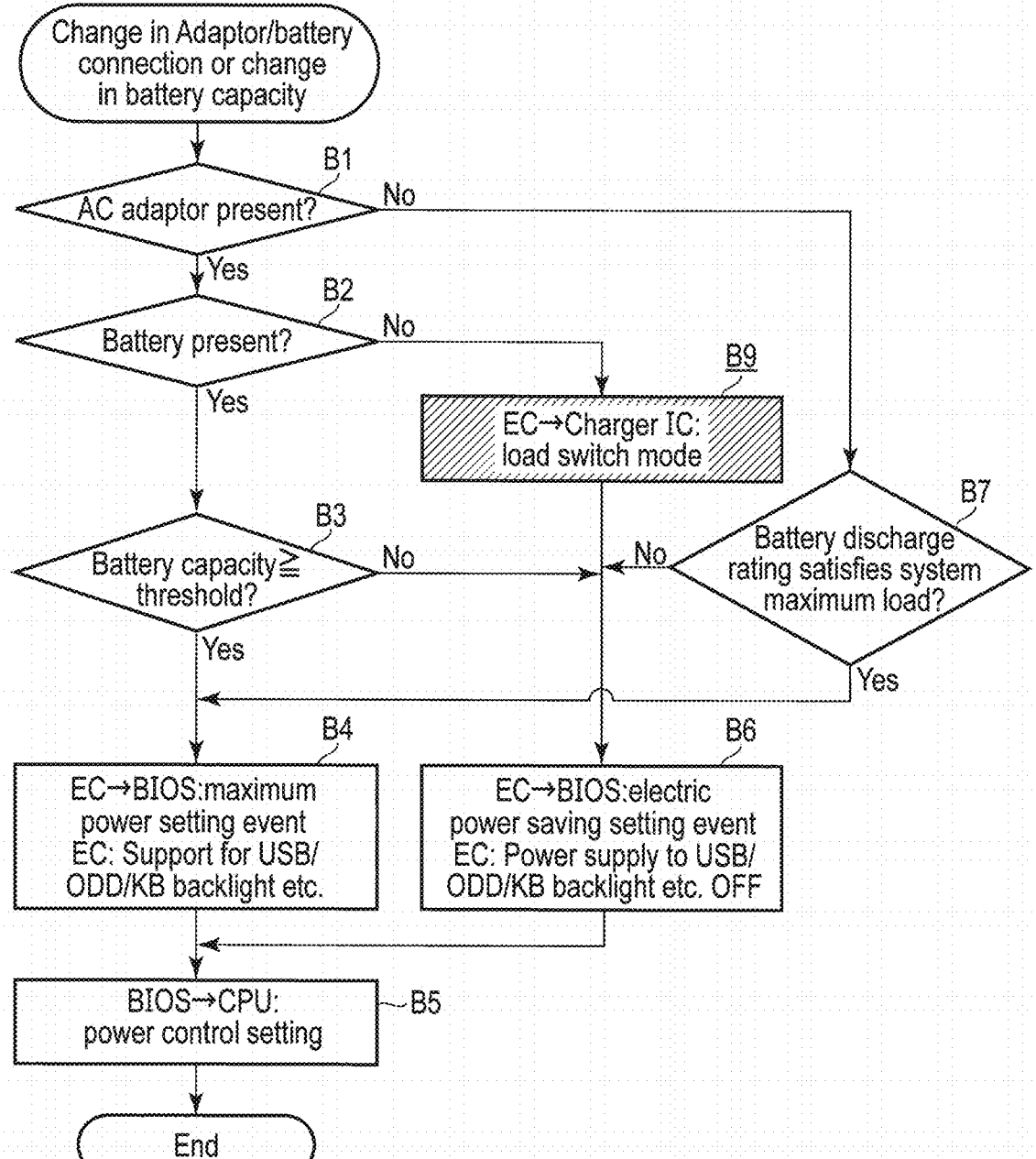
FIG. 14 is a view showing an example of setting of a system power voltage value to a charger IC by an embedded controller of an electric power supply system of a sixth embodiment.
FIG. 15 is a flowchart showing an example of an operation procedure of the electric power supply system of the sixth embodiment.

FIG. 14 is a view showing an example of setting of the system power voltage value by the embedded controller 15 to the charger IC 132 which controls the step-up/step-down DD converter in the system-power supply control unit 131. It should be noted that as in the case of the fourth embodiment, the system power in FIG. 14 indicates the voltage value of the system power to be created and output by the power circuit 13.

As shown in FIG. 14, when the battery pack 12 is attached, the embedded controller 15 sets the voltage value of the system power to the battery specification value, more specifically, to the full-charge voltage value of the battery pack 12. On the other hand, when the battery pack 12 is not attached, the embedded controller 15 shifts the step-up/step-down DD converter of the system-power supply control unit 131 to the load switch mode, whereby the embedded controller 15 sets the voltage value of the system power to the adaptor specification value, more specifically, to the voltage value of the power from the AC adaptor 11.

FIG. 15 is a flowchart showing an example of an operation procedure of the NVDC electric power supply system 1 of this embodiment. This flowchart shows the operation procedures of the embedded controller 15 and BIOS 16 in the case where a change in the connection (attachment) state of the AC adaptor 11 or the battery pack 12 or a change in the capacity of the battery pack 12 has occurred.

In FIG. 15, steps B1 through B7 are identical to the second embodiment, and hence their descriptions are omitted (see FIG. 5). In the NVDC electric power supply system 1 of this embodiment, when the AC adaptor 11 is connected (YES in step B1), and the battery pack 12 is not attached (NO in step B2), the embedded controller 15 performs setting of the load switch mode to the charger IC 132 (step B9) in place of the high-efficiency mode (step B8 of FIG. 11) of the fourth embodiment. By this setting, the charger IC 132 shifts the step-up/step-down DD converter of the system-power supply control unit 131 to the load switch mode in which operations of all the four FETs are stopped.

As described above, the NVDC electric power supply system 1 of this embodiment realizes the safe and efficient use of power from the AC adaptor and power from the battery.

Seventh Embodiment

Next, a seventh embodiment will be described below.

FIG. 16 is a view showing an example of a configuration of the NVDC electric power supply system 1 of this embodiment.

As described in the first embodiment, a case where this NVDC electric power supply system 1 is applied to a notebook PC to/from which an extension unit incorporating therein an ODD can freely be attached/detached is assumed.

As shown in FIG. 16, in the NVDC electric power supply system 1 of this embodiment, the power circuit 13 further includes a power supply-line bifurcating unit 133, and switch 134 for switching one of power supply lines bifurcated by the power supply-line bifurcating unit 133 between the on-state and off-state.

When the extension unit is attached to the notebook PC, power is input from the Dock side AC adaptor 11B. Further, as described in the first embodiment, the rating of the Dock side AC adaptor 11B regarding which it is conceivable that the power can be consumed by the ODD and the like is set larger than the rating of the main body side adaptor 11A. When the power from the AC adaptors 11 including the Dock side AC adaptor 11B is supplied to the extension unit which is part of the load through die system-power supply control unit 131, an increase in the size of the FET is caused by the high-current countermeasures taken in the system-power supply control unit 131, and lowering of the power supply efficiency is caused by the switching loss.

Thus, in the NVDC electric power supply system 1 of this embodiment, only when power is input from the Dock side AC adaptor 11B, one of the power supply lines bifurcated by the power supply-line bifurcating unit 133 is led to the extension unit side without being passed through the system-power supply control unit 131. The other of the power supply lines bifurcated by the power supply-line bifurcating unit 133 is led to the system-power supply control unit 131 as before, and the system power created and output by the system-power supply control unit 131 is supplied to the load on the main body side.

One of the power supply lines bifurcated by the power supply-line bifurcating unit 133 is switched between the on-state (conduction) and off-state (shutdown) by the switch 134 under the control of the embedded controller 15. One of the power supply lines bifurcated by the power supply-line bifurcating unit 133 and the power supply line configured to supply the system power created and output by the system-power supply control unit 131 to the load are connected in parallel with each other with a thyristor interposed between them, and the power of one of the two lines is supplied to the load on the extension unit side.

When the power is input from the Dock side AC adaptor 11B, the embedded controller 15 which can determine the type of the AC adaptor 11 by use of the AC adaptor A/D converting unit 151 turns the switch 134 on. Thereby, part of the power from the Dock side AC adaptor 11B is bifurcated by the power supply-line bifurcating unit 133 and is thereafter supplied to the load on the extension unit side without being passed through the system-power supply control unit 131. On the other hand, when the power is input from the main body side AC adaptor 11A, the embedded controller 15 turns the switch 134 off. Thereby, the bifurcation formed by the power supply-line bifurcating unit 133 is substantially nullified, and the power created and output by the system-power supply control unit 131 is supplied to the load on the extension unit side together with the load on the main body side.

As described above, by virtue of the configuration in which only the power from the Dock side AC adaptor 115 is bifurcated by the power supply-line bifurcating unit 133, and control of the embedded controller 15, it is possible to prevent the size of the FET from being increased by the high-current countermeasures taken in the system-power supply control unit 131, and prevent the power supply efficiency from being lowered by the switching loss.

FIG. 17 is a flowchart showing an example of an operation procedure of the NVDC electric power supply system 1 of this embodiment.

First, the embedded controller determines presence/absence of connection of the AC adaptor 11 (step E1). When the AC adaptor 11 is connected (YES in step E1), the embedded controller 15 determines the type of the connected AC adaptor (step E2). When the connected AC adaptor is the main body side AC adaptor 11A (YES in step E3), the embedded controller 15 turns the switch 134 of the power circuit 13 off (step E4). Also when the AC adaptor 11 is not connected (NO in step E1), the embedded controller 15 turns the switch 134 of the power circuit 13 off (step E4). On the other hand, when the connected AC adaptor is the Dock side AC adaptor 11B (NO in step E3), the embedded controller 15 turns the switch 134 of the power circuit 13 on (step E5).

As described above, the NVDC electric power supply system 1 of this embodiment realizes the safe and efficient use of power from the AC adaptor and power from the battery.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electric power supply system comprising:
a processor that comprises a first controller configured to modify an operating frequency of the processor and a second controller configured to modify an operating power of the processor;
a power circuit that detects a presence or an absence of a battery, creates a third power output to output to a load comprising the processor using a first power from an adaptor and a second power from the battery, and outputs the third power to the load comprising the processor; and
an embedded controller that detects the presence or the absence of the battery at least partially in parallel with detection by the power circuit, wherein
the power circuit instructs the first controller to modify the operating frequency, and instructs the first controller to stop modifying the operating frequency according to an instruction from the embedded controller when the power circuit detects removal of the battery, and
the embedded controller causes the second controller to modify the operating power by notifying a Basic Input/Output System (BIOS) of removal of the battery when the embedded controller detects the removal of the battery, and instructs the power circuit to instruct the first controller to stop modifying the operating frequency of the processor after causing the second controller to modify the operating power, the BIOS comprising a program executed by the processor.

2. An electric power supply system comprising:
a processor that operates by power at a first set value in a normal mode, and operates by power at a second set value greater than the first set value in a high-load mode;
a power circuit that creates a third power to output to a load comprising the processor and a predetermined device using a first power from an adaptor and a second power from a battery, and outputs the third power to the load comprising the processor and the predetermined device; and
an embedded controller that detects a presence or an absence of the battery, wherein
the embedded controller notifies a Basic Input/Output System (BIOS) of the removal of the battery and shuts down the supply of power to the predetermined device in response to detecting the absence of the battery, the BIOS being a program executed by the processor,
the notification of the removal of the battery causes the BIOS to update at least one of the first set value or the second set value to lower at least one of the first set value or the second set value, and
the shutdown of the power supply to the predetermined device is performed within a short period of time as compared with the update of the at least one of the first set value or the second set value caused by the notification of the removal of the battery.

3. The electric power supply system of claim 2, wherein
the embedded controller detects a remaining battery level of the battery,
the embedded controller notifies the BIOS of the remaining battery level of the battery and shuts down the supply of power to the predetermined device when the remaining battery level of the battery falls below a reference value,
the notification of the remaining battery level of the battery causes the BIOS to update at least one of the first set value and the second set value to lower at least one of the first set value and the second set value, and
the shutdown of the power supply to the predetermined device is performed within a short period of time as compared with the update of the at least one of the first set value or the second set value caused by the notification of the remaining battery level of the battery.

4. The electric power supply system of claim 2, wherein the notification of the removal of the battery causes the BIOS to update both of the first set value and the second set value to lower both of the first set value and the second set value in a state where the processor operates in any one of the normal mode and the high-load mode.

5. The electric power supply system of claim 2, wherein the predetermined device is at least one input/output device configured to read and write data on a non-transitory computer readable recording medium.

* * * * *